(12) United States Patent
Noh et al.

(10) Patent No.: US 11,239,954 B2
(45) Date of Patent: Feb. 1, 2022

(54) ENCODING METHOD ON BASIS OF POLAR CODE IN ORDER TO SUPPORT HARQ, AND WIRELESS DEVICE USING SAME

(71) Applicant: LG Electronics Inc., Seoul (KR)

(72) Inventors: Kwangseok Noh, Seoul (KR); Bonghoe Kim, Seoul (KR); Song-Nam Hong, Seoul (KR); Min-Oh Jung, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/756,069

(22) PCT Filed: Nov. 13, 2018

(86) PCT No.: PCT/KR2018/013793
§ 371 (c)(1),
(2) Date: Apr. 14, 2020

(87) PCT Pub. No.: WO2019/093855
PCT Pub. Date: May 16, 2019

(65) Prior Publication Data
US 2020/0304241 A1    Sep. 24, 2020

Related U.S. Application Data

(60) Provisional application No. 62/585,495, filed on Nov. 13, 2017.

(51) Int. Cl.
*H04L 1/18* (2006.01)
*H03M 13/13* (2006.01)
(Continued)

(52) U.S. Cl.
CPC .......... *H04L 1/1812* (2013.01); *H03M 13/13* (2013.01); *H03M 13/6362* (2013.01); *H04L 1/0041* (2013.01); *H04L 1/0071* (2013.01)

(58) Field of Classification Search
CPC ... H04L 1/0041; H04L 1/0046; H04L 1/0071; H04L 1/1812; H03M 13/13; H03M 13/6362; H03M 13/6343
See application file for complete search history.

(56) References Cited

U.S. PATENT DOCUMENTS 9,742,440 B2    8/2017   El-Khamy et al.
9,780,918 B2    10/2017  Shen et al.
(Continued)

FOREIGN PATENT DOCUMENTS

WO    WO2017176309    10/2017

OTHER PUBLICATIONS

Wang et al., Efficient HARQ scheme based on rate-compatible punctured polar codes, Oct. 24, IEEE, pp. 1 to 6. (Year: 2017).*
(Continued)

*Primary Examiner* — Shelly A Chase
(74) *Attorney, Agent, or Firm* — Fish & Richardson P.C.

(57) ABSTRACT

An encoding method on the basis of a polar code in order to support an HARQ according to the present embodiment comprises the steps of: configuring, an input vector for retransmission, which has a length of N and is applied to a mother matrix predetermined on the basis of a polar code, by a wireless device, wherein the input vector is defined on the basis of a first index set for an optimized position of an information bit having a length of K, a second index set for a position of a bit to be punctured among encoded bits generated on the basis of the mother matrix, and a third index set for a position of at least one unknown frozen bit associated with an information copying scheme; and performing encoding on the basis of the input vector and the mother matrix, by the wireless device.

19 Claims, 15 Drawing Sheets

(51) Int. Cl.
*H03M 13/00* (2006.01)
*H04L 1/00* (2006.01)

(56) References Cited

U.S. PATENT DOCUMENTS

| | | | |
|---|---|---|---|
| 10,826,532 B2* | 11/2020 | Gritsenko | H03M 13/13 |
| 2019/0028119 A1* | 1/2019 | Yang | H03M 13/6343 |
| 2019/0393986 A1* | 12/2019 | Wang | H04L 1/0046 |

OTHER PUBLICATIONS

Kim et al., "Low Complexity List Decoding for Polar Codes with Multiple CRC Codes," Entropy, dated Apr. 24, 2017, 14 pages.
Huawei, HiSilicon, "Summary of polar code design for control channels," R1-1700088, 3GPP TSG RAN WG1 Ad-Hoc Meeting, Spokane, USA, dated Jan. 16-20, 2017, 12 pages.

* cited by examiner capacity (a) N=2 capacity (b) N=4

Capacity (c) $N=2^{10}$

ENCODING METHOD ON BASIS OF POLAR CODE IN ORDER TO SUPPORT HARQ, AND WIRELESS DEVICE USING SAME

CROSS-REFERENCE TO RELATED APPLICATIONS

This application is a National Stage application under 35 U.S.C. § 371 of International Application No. PCT/KR2018/013793, filed on Nov. 13, 2018, which claims the benefit of U.S. Provisional Application No. 62/585,495 filed on Nov. 13, 2017. The disclosures of the prior applications are incorporated by reference in their entirety.

BACKGROUND

Field

The present specification relates to wireless communication, and more particularly, to a method of performing encoding based on a polar code to support hybrid automatic repeat request (HARQ), and a wireless device using the method.

Related Art

It is important to transfer data without error from a transmitter to a receiver in a data communication system. In 1948, Shannon mathematically investigated a limitation of a maximum data transfer rate at which data can be transferred without error, which is called channel capacity. In order to implement a real communication system close to the channel capacity, an error correction code having implementable complexity must exist. Several types of error correction codes have been developed since 1948, and turbo codes and low density parity check (LDPC) or the like have been developed relatively recently as error correction codes which exhibit performance close to channel capacity of Shannon. However, although these codes exhibit performance close to the channel capacity of Shannon, accurate channel capacity is not achieved. A polar code has recently been developed as a code which completely satisfies the channel capacity mathematically while satisfying such a problem.

HARQ is a technique which recovers an error by requesting for retransmission upon receiving an erroneous packet.

SUMMARY

The present specification provides a method of performing encoding based on a polar code to support hybrid automatic repeat request (HARQ), and a wireless device using the method.

A method of performing encoding based on a polar code to support HARQ according to the present embodiment includes configuring, by a wireless device, a length-N input vector (where N is a natural number) applied to a mother matrix predetermined based on the polar code, defining the input vector based on a first index set for an optimized location of a length-K information bit (where K is a natural number), a second index set for a location to be punctured among coded bits generated based on the mother matrix, and a third index set for a location of at least one unknown frozen bit associated with an information copy scheme, and performing, by the wireless device, encoding based on the input vector and the mother matrix.

The present specification provides a method of performing encoding based on a polar code to support HARQ with improved performance, and a wireless device using the method.

DESCRIPTION OF EXEMPLARY EMBODIMENTS

The above-described features and the following detailed description are exemplary contents for helping a description and understanding of the present specification. That is, the present specification is not limited to this embodiment and may be embodied in other forms. The following embodiments are merely examples to fully disclose the present specification, and are descriptions to transfer the present specification to those skilled in the art. Therefore, when there are several methods for implementing components of the present specification, it is necessary to clarify that the present specification may be implemented with a specific one of these methods or equivalent thereof.

In the present specification, when there is a description in which a configuration includes specific elements, or when there is a description in which a process includes specific steps, it means that other elements or other steps may be further included. That is, the terms used in the present specification are only for describing specific embodiments and are not intended to limit the concept of the present specification. Furthermore, the examples described to aid the understanding of the present specification also include complementary embodiments thereof.

The terms used in the present specification have the meaning commonly understood by one of ordinary skill in the art to which the present specification belongs. Terms commonly used should be interpreted in a consistent sense in the context of the present specification. Further, terms used in the present specification should not be interpreted in an idealistic or formal sense unless the meaning is clearly defined. Hereinafter, embodiments of the present specification will be described with reference to the accompanying drawings.

Figure 1:
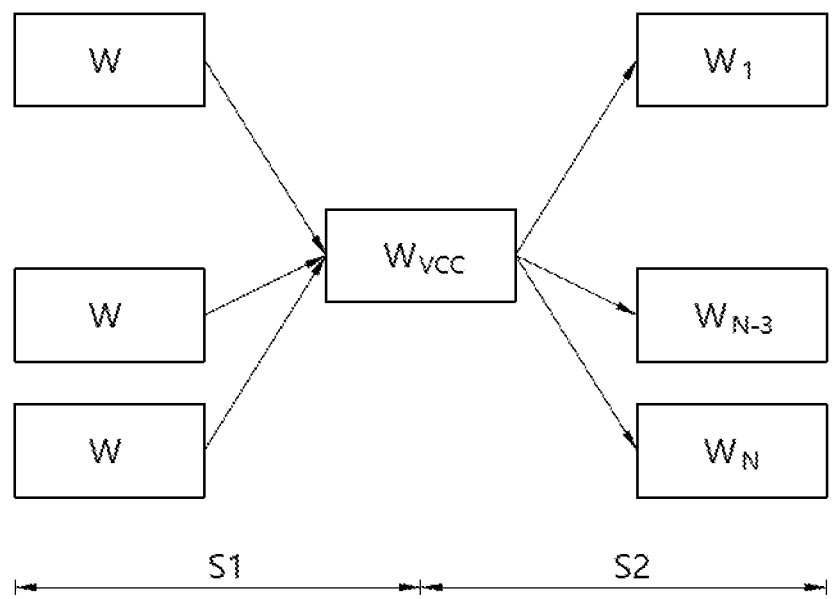
FIG. 1 shows the concept of polar encoding.

FIG. 1 shows the concept of polar encoding.

Referring to FIG. 1, a polar encoding process using a polar code may include a channel combining step S1 and a channel splitting step S2.

Referring to FIG. 1, a plurality of basic channels W may be properly combined to generate a vector channel Wvcc. In addition, the generated vector channel Wvcc may be split to generate polarized new channels. For example, for a channel having an infinite length, a channel capacity may be classified into a channel capacity C(W)=0 and a channel capacity C(W)=1.

For example, a channel of which a channel capacity C(W) is '1' may be allocated for transmission of an information bit since error-free transmission is possible. A channel of which a channel capacity C(W) is '0' may be allocated for transmission of a frozen bit which is a meaningless bit since transmission information transmission is impossible.

Figure 2:
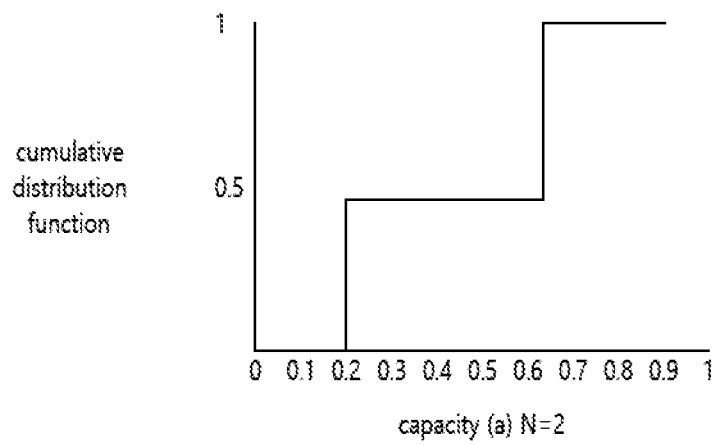
FIG. 2 shows a polarization tendency depending on a length of a code block.
Figure 2:
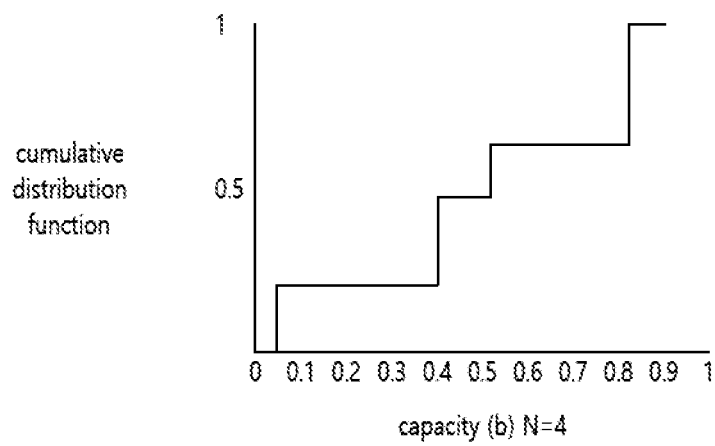
Figure 2:
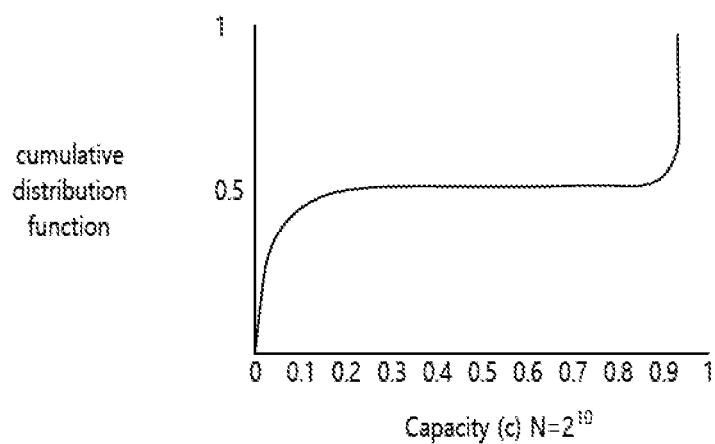

FIG. 2 shows a polarization tendency depending on a length of a code block.

Referring to (a) to (c) of FIG. 2, it will be understood that a channel capacity is polarized to 1 or 0 with an increase in a length N of a code block.

Figure 3:
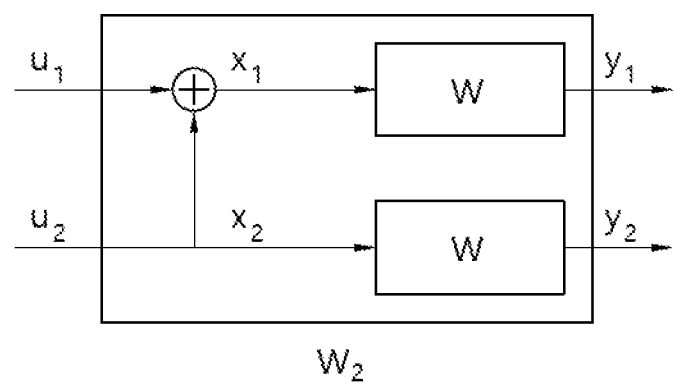
FIG. 3 shows a base module of a polar code.

FIG. 3 shows a base module of a polar code.

Referring to FIG. 1 to FIG. 3, the aforementioned channel combination may be performed by permuting binary-input discrete memoryless channels (B-DMCs) in parallel.

For example, a size of the code block may be determined based on a channel combination. For example, in FIG. 3, W may denote a B-DMC. The base module of the polar code of FIG. 3 may combine two B-DMCs.

For example, u1 and u2 of FIG. 3 may be binary-input source bits. x1 and x2 of FIG. 3 may be an input to a corresponding channel W. y1 and y2 of FIG. 3 may be output coded bits. In addition, a channel equivalent to the entire channel may be denoted by W2.

For example, a result value of an XOR operation of u1 and u2 may be included in x1. In addition, u2 may be included in x2 without an additional operation. Eventually, a base matrix F for the base module of the polar code of FIG. 3 may be expressed by Equation 1 below.

$$F = \begin{bmatrix} 1 & 0 \\ 1 & 1 \end{bmatrix}$$ [Equation 1]

If N B-DMCs are combined, each channel may be expressed in a recursive form. In addition, a vector x for an output bit of an encoder may be expressed by using Equation 2 below.

$$x_1^N = u_1^N G_N$$ [Equation 2]

Referring to Equation 2 above, the vector x for the output bit of the encoder may be expressed by Equation 3 below, and a vector u for an input bit of the encoder may be expressed by Equation 4 below.

$$x_1^N = \{x_1, \ldots, x_N\}$$ [Equation 3]

$$u_1^N = \{u_1, \ldots, u_N\}$$ [Equation 4]

For example, in a polar code of a length-N code block, a code rate is N/K assuming that K bits are input. In this case, among {u1, . . . , uN}, K bits may be understood as bits for payload.

In addition, referring to Equation 2 above, a generation matrix GN of Equation 5 below may be expressed in a form of a Kronecker product of the base matrix F of Equation 1.

$$G_N = F^{\otimes N}$$ [Equation 5]

$$F^{\otimes N} = F \otimes F^{\otimes (N-1)} \text{(but, } F^{\otimes(0)}=1\text{)}$$ [Equation 6]

For example, according to Equation 5 and Equation 6, a 2×2-sized generation matrix G1 may correspond to Equation 1.

In addition, according to Equation 5 and Equation 6, a 4×4-sized generation matrix G2 may be as shown in Table 1 below.

TABLE 1

$$\begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

In addition, according to Equation 5 and Equation 6, an 8×8-sized generation matrix G may be as shown in Table 2 below.

TABLE 2

$$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

In the present specification, a generation matrix GN according to Equation 5 above may be referred to as a mother matrix predetermined based on a polar code.

In addition, in the present specification, unlike in the case of FIG. 4 described below, it is premised that an operation for a bit-reverse permutation exists not in an encoding part but in a decoding part.

Figure 4:
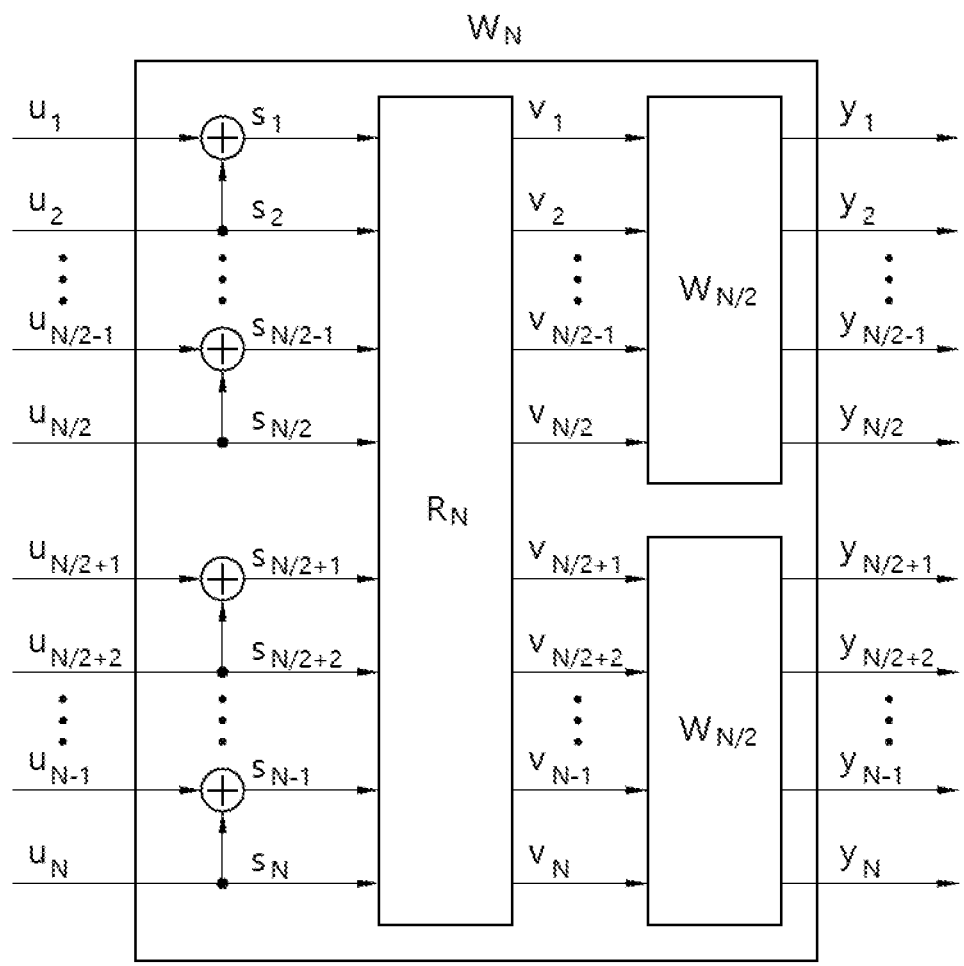
FIG. 4 is a drawing for an example of a channel combination having a level N.

FIG. 4 is a drawing for an example of a channel combination having a level N. For example, it may be understood in FIG. 4 that an operation for a bit-reverse permutation exists in an encoding part. Referring to FIG. 4, a size N of a code block may have a restriction of 2^n (where n is a natural number).

For example, decoding of a polar code may be performed by using successive cancellation (SC) decoding. Herein, an SC decoding scheme may be performed by calculating a channel transition probability and then by calculating a likelihood ratio (LLR) for an input bit based on the calculated probability.

In this case, given that channel combining and channel splitting processes are recursive, the channel transition probability may be calculated recursively. That is, an LLR value may also be calculated recursively.

Hereinafter, a payload bit on which data is transmitted may be referred to as a data bit, and the remaining bits (e.g., bits on which actual data is not transmitted) other than the payload bit may be referred to as a frozen bit.

In the polar code, a location of a bit to be determined as a data bit or a frozen bit in the code block may be an issue to be considered. For example, a location of the data bit and a location of the frozen bit may be determined based on a channel capacity of each channel.

Figure 5:
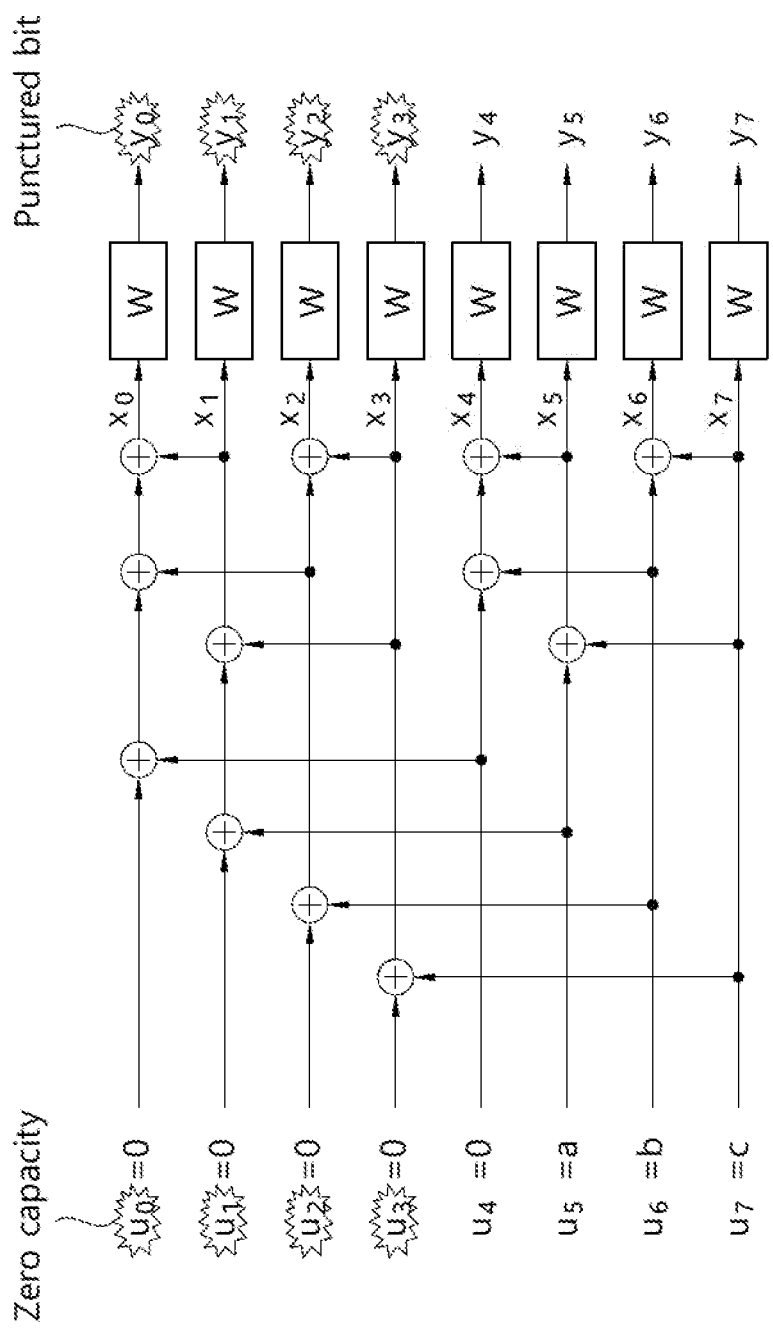
FIG. 5 shows the concept for a reciprocal characteristic based on puncturing according to the present embodiment.

FIG. 5 shows the concept for a reciprocal characteristic based on puncturing according to the present embodiment.

In the present specification, a generation matrix GN, i.e., an input vector to be applied to a mother matrix, may be defined as {u0, u1, . . . , um−1, where m is a natural number}.

For example, an input vector for an 8×8-sized generation matrix G3 of Table 2 may be defined as {u0, u1, . . . , u7}. In addition, a location index for the input vector may be defined as {0, 1, . . . , N−1}.

Referring to FIG. 5, a length-8 input vector (e.g., u0, . . . , u7) may be encoded to a vector set (e.g., x0, . . . , x7) encoded based on a length-8 polar code according to Equation 2.

For example, it may be understood that {y0, . . . , y7} can be received in a receiving end when a coded vector set {x0, . . . , x7} passes through each channel W.

In the present specification, a puncturing pattern $P_N$ may be defined as shown in Equation 7 below.

$$P_N = (P_0, \ldots, P_{N-1})$$ [Equation 7]

Herein, $P_i=0$ may imply that an i-th coded bit is not transmitted. For example, when the puncturing pattern is expressed by $P_N=(0,0,0,0,1,1,1,1)$ as shown in FIG. 5, location indices of punctured coded bits may be expressed by B_PN={0,1,2,3}.

That is, no information can be transmitted through a channel corresponding to an input vector (i.e., u0,u1,u2,u3) associated with B_PN={0,1,2,3}. In other words, each input vector (i.e., u0,u1,u2,u3) associated with B_PN={0,1,2,3} may be understood as a channel having a zero capacity.

According to a reciprocal characteristic based on puncturing mentioned in the present specification, an index of channels (e.g., u0 to u3) having a zero capacity as shown in FIG. 5 may be identical to an index of punctured bits (e.g., y0,y1,y2,y3).

Further, according to the reciprocal characteristic based on puncturing, an input vector (e.g., u0,u1,u2,u3) corresponding to punctured bits (e.g., y0,y1,y2,y3) may be set to a frozen vector set having known values.

Figure 6:
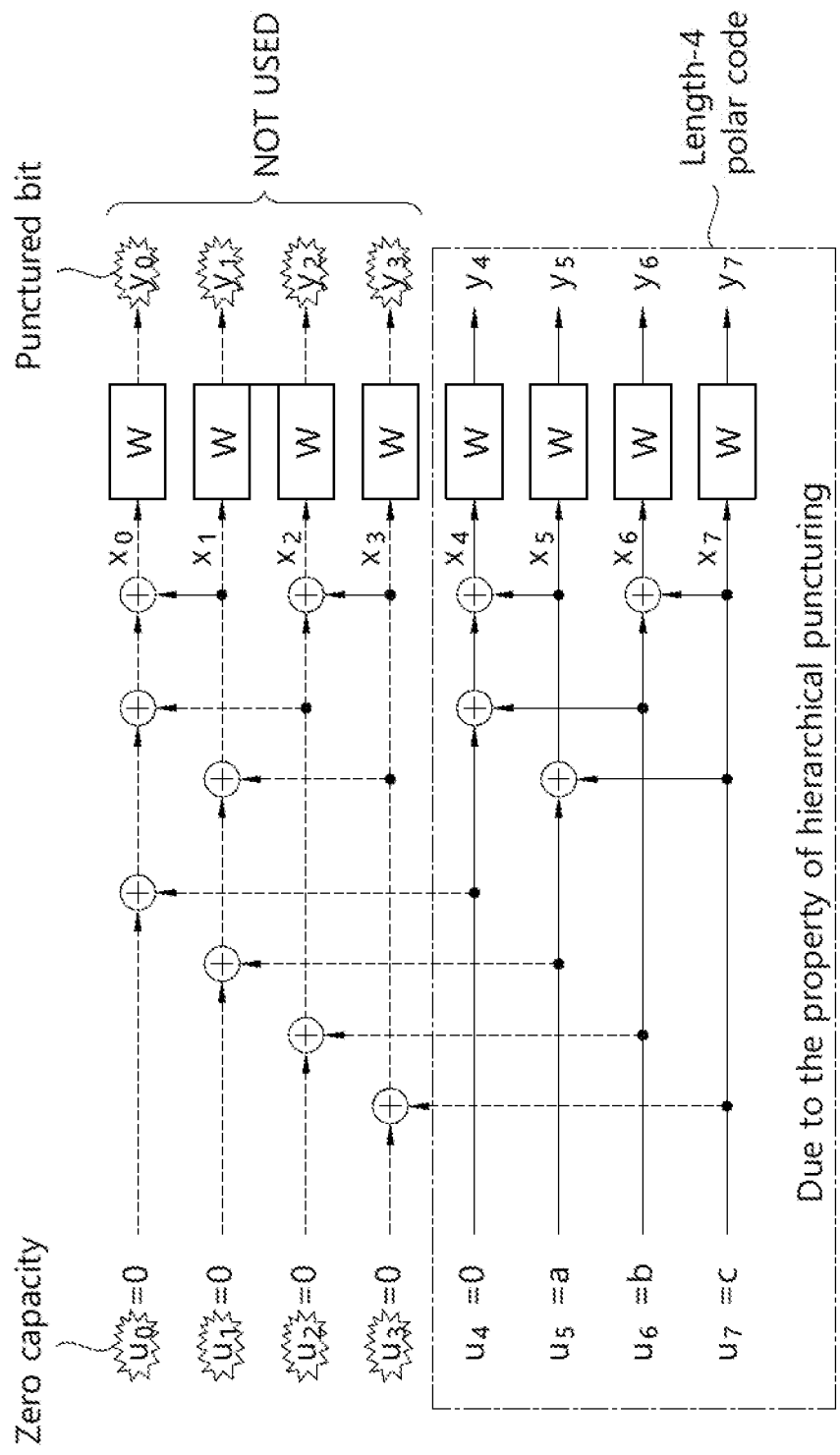
FIG. 6 is a conceptual view for a puncturing pattern based on a hierarchical characteristic based on puncturing according to the present embodiment.

FIG. 6 is a conceptual view for a puncturing pattern based on a hierarchical characteristic based on puncturing according to the present embodiment.

Referring to FIG. 5 and FIG. 6, when location indices {0} to {3} are successively punctured, a successive puncturing pattern may be understood as a puncturing pattern reflecting a hierarchical characteristic.

For a clear and concise understanding of FIG. 6, it may be assumed that input vectors (e.g., u0, u1, u2, u3) respectively corresponding to B_PN={0,1,2,3} are channels having a zero capacity.

A size of a mother matrix for the polar code of FIG. 6 may be '8', and a size of a codeword based on B_PN={0,1,2,3} may be '4'. In this case, it may be assumed that a size of an information bit is '3'.

In addition, to transmit a length-3 information bit, it may be assumed that an index of an information bit set Ac1 for an optimized location on the polar code is {5,6,7}. For example, an index of the information bit set Ac1 may be determined by considering a sequence and/or puncturing pattern used in an encoder input of the polar code.

For example, an unknown bit 'a' may be located at u5, an unknown bit 'b' may be located at u6, and an unknown bit 'c' may be located at u7.

A seed puncturing pattern may be mentioned in the present specification. For example, a bit index set of the seed puncturing pattern may be defined through Equation 8 below.

$$B_{\overline{PN}}{}^{\overline{N}} = \{0, 1, \ldots, \overline{N}\} \text{ for some integer } \overline{N}=2^{\overline{n}} \text{ with } 1 \leq \overline{n} \leq n$$ [Equation 8]

Referring to FIG. 6, it will be understood that, when x0 corresponding to u0 is punctured, coded bit values corresponding to u1 to u7 are not affected.

In other words, due to a hierarchical characteristic according to the present embodiment, a change in an input value at a relatively high location cannot affect an output value for an input value at a relatively low location.

An encoder according to an embodiment of FIG. 6 may not transmit a value at a location at which a puncturing pattern is '0' among coded bits x0 to x7, by considering a puncturing pattern (e.g., $P_N=(0,0,0,0,1,1,1,1)$).

Referring to FIG. 6, coded bits (e.g., x4,x5,x6,x7) to be transmitted may be decoded by using a polar code having a smaller size than a polar code before puncturing.

For example, in a decoding step, the to-be-transmitted coded bits (e.g., x4,x5,x6,x7) of FIG. 6 may use a length-4 mother matrix (e.g., Table 1) instead of a length-8 mother matrix (e.g., Table 2). In this case, from a perspective of reception, a code rate R1 (i.e. K/N) may be 3/4.

Figure 7:
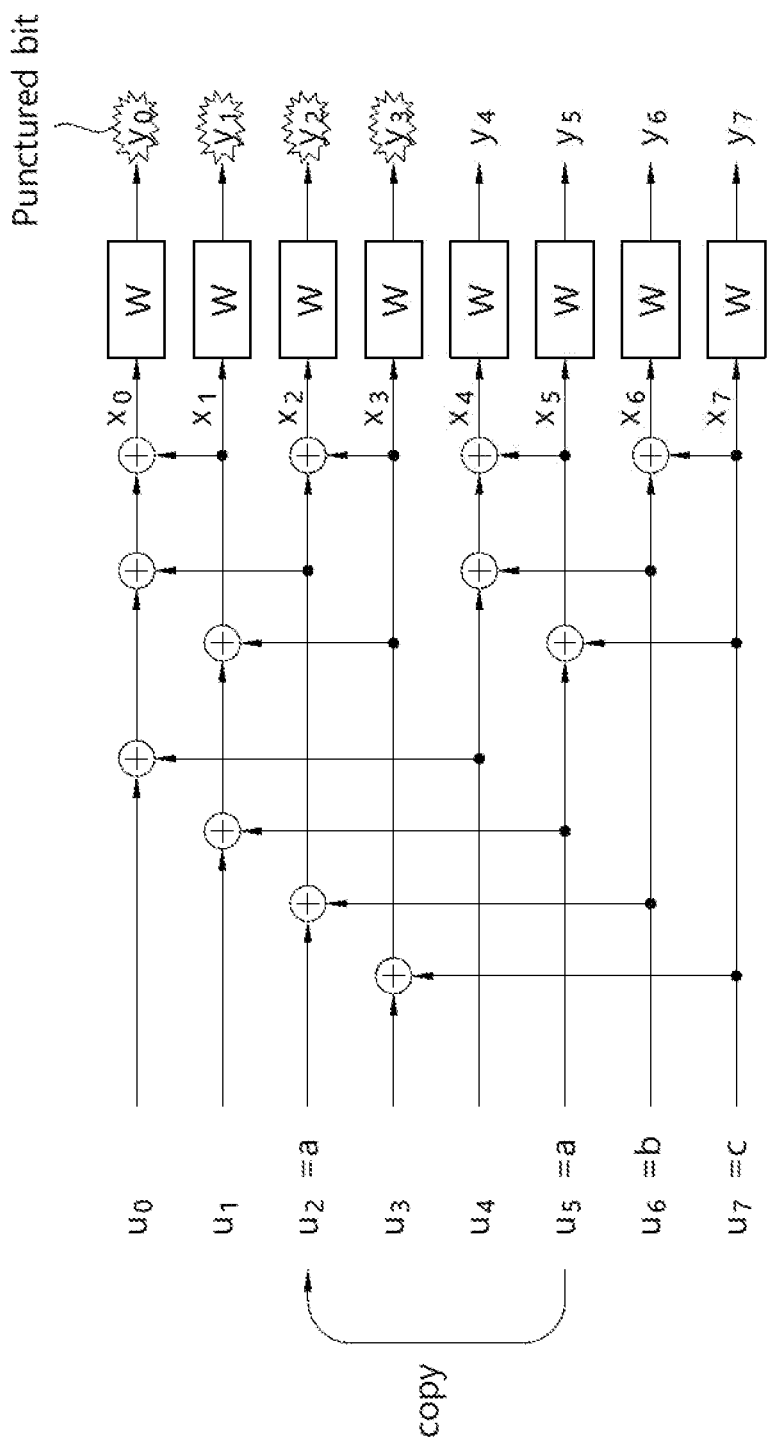
FIG. 7 is a conceptual view for a method of performing encoding based on a polar code to support HARQ according to the present embodiment.

FIG. 7 is a conceptual view for a method of performing encoding based on a polar code to support HARQ according to the present embodiment.

Referring to FIG. 5 to FIG. 7, an input vector for an 8×8-sized mother matrix G3 of Table 2 may be defined as {u0, u1, . . . , u7}. That is, a location index for the input vector of FIG. 7 may be defined as {0, 1, . . . }.

For example, a puncturing pattern of FIG. 7 may have a location index of B_PN={0,1}, and may be understood as a puncturing pattern reflecting a hierarchical characteristic.

According to the present embodiment, a decoding order of an output bit set (e.g., y0, . . . , y7) may be predetermined. For example, coded output values (i.e., y0, y4, y2, y6, y1, y5, y3, y7) may be sequentially decoded based on the order of u0, u4, u2, u6, u1, u5, u3, u7.

For a clear and concise understanding of FIG. 7, FIG. 7 is described by premising a case where HARQ retransmission is performed after previous transmission corresponding to FIG. 6 fails. That is, an input vector {u0, u1, . . . , u7} of FIG. 7 may be configured for HARQ retransmission.

For example, each of input vectors (e.g., u0, u1) corresponding to B_PN={0,1} may be understood as a channel having a zero capacity. For example, a size of the mother matrix for the polar code of FIG. 7 may be '8', which is the same as that of FIG. 6, and a codeword size of FIG. 7 may be '6' which is expanded from previous transmission in consideration of HARQ retransmission.

In addition, it may be assumed that a size of an information bit is '3', which is the same as that of previous transmission. In addition, it may be assumed that, for transmission of a length-3 information bit, an index of an information bit set Ac2 for an optimized location on a polar code is {2,6,7}. In this case, the index of the information bit set Ac2 may be determined by considering a sequence and/or puncturing pattern used in an encoder input of the polar code.

In the present specification, a rate-compatibility condition implies that a value of an information bit previously transmitted cannot be changed in HARQ retransmission.

For example, an information bit must be included in an input vector (e.g., u5,u6,u7) corresponding to Ac1={5,6,7} of FIG. 6 used in previous transmission for HARQ retransmission according to FIG. 7.

However, according to the aforementioned assumption, since an index of an optimized information bit set Ac2 is {2,6,7} in FIG. 7, performance may deteriorate when transmission is performed by considering only a rate-compatibility condition.

According to an embodiment of FIG. 7, since an information copy scheme is applied, an encoder may copy an information bit located at u5 to u2 and then use the existing u5 as an unknown frozen bit.

In this case, from a perspective of decoding, when y5 is decoded, a decoder may use information on y2 decoded first.

In addition, considering a length 6 of to-be-transmitted encoded bits x2, x3, x4, x5, x6, and x7 of FIG. 7, a length-8 mother matrix (e.g., Table 2) may be used to decode the coded bits x2, x3, x4, x5, x6, and x7. In this case, from a perspective view of reception, a code rate R2 (i.e. K/N) may be 3/8.

Referring to FIG. 7, when an information copy scheme is applied in HARQ retransmission, an information bit may be included at a location for Ac2={2,6,7} while satisfying a rate-compatibility condition.

However, it will be understood that the present specification is not limited to the embodiment of FIG. 7. For example, when N=8, since u3 has a higher channel capacity than u2, u2 is first used as a frozen bit between u2 and u3. Considering such a characteristic, an information bit located at u5 may be copied to u3.

In this case, from a perspective of decoding, when y3 is decoded, a decoder may use information on y5 decoded first.

Figure 8:
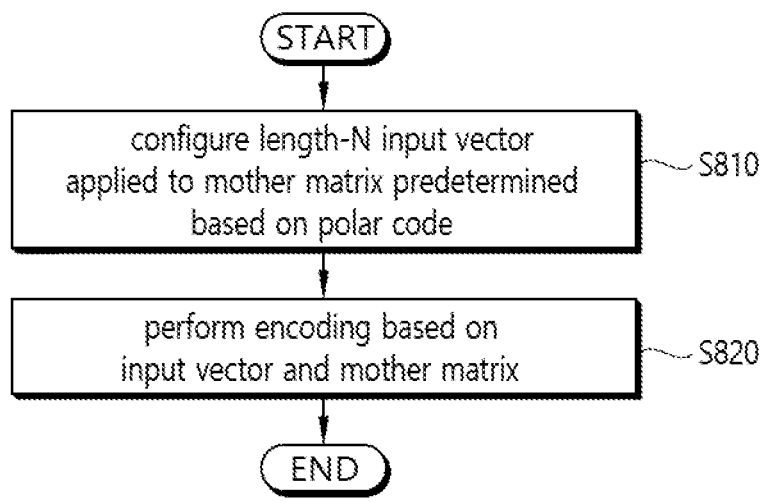
FIG. 8 is a flowchart of a method of performing encoding based on a polar code to support HARQ according to the present embodiment.

FIG. 8 is a flowchart of a method of performing encoding based on a polar code to support HARQ according to the present embodiment.

In step S810, a wireless device may configure a length-N input vector (N is a natural number) applied to a mother matrix predetermined based on the polar code. The input vector may be defined as {u0, u1, . . . , uN−1}. For example, a location index for the input vector may be {0, 1, . . . , N−1}.

Herein, the input vector may be defined based on first to third index sets. For example, the first index set may indicate an optimized location of a length-K information bit (K is a natural number).

For example, the second index set may indicate a location to be punctured among coded bits generated based on a mother matrix.

For example, the third index set may indicate a location of at least one unknown frozen bit generated according to an information copy scheme.

In other words, the first index set to the third index set may be defined based on {0, 1, . . . , N−1}.

According to the present embodiment, a decoding order of output bits may be predetermined due to a structural characteristic of the mother matrix based on the polar code. For example, when N is '8', output bits corresponding to location indices {0}, {4}, {2}, {6}, {3}, {7} may be sequentially decoded.

When the input vector of step S810 is used for HARQ retransmission, the input vector may be configured to include all length-I second information bits (where I is a natural number) for previous transmission.

In addition, when the input vector of step S810 is used for HARQ retransmission, the number of elements included in the second index set may be configured to be less than that in the previous transmission.

For example, when K and I are both '3', it may be assumed that the first index set is {a, b, c}, and the optimized location index for the second information bit for previous transmission is {d, b, c}.

That is, the information included in the location index {d} may be copied to a location index decoded before the location index {d} based on the information copy scheme.

In this case, when the location index {d} is copied to the location index {a}, the third index set of the input vector for HARQ retransmission may include {d}.

In step S820, the wireless device may perform encoding based on an input vector and a mother matrix.

Although not shown in the figure, the first wireless device according to the present embodiment may determine at least one coded bit to be transmitted based on the second index set (i.e., puncturing pattern) among length-N coded bits. Next, the wireless device may transmit the at least one coded bit to the second wireless device.

Eventually, according to the present specification, when performing HARQ retransmission, an information bit can be transmitted through an optimized location while satisfying a rate-compatibility condition, thereby improving encoding performance of the wireless device.

Figure 9:
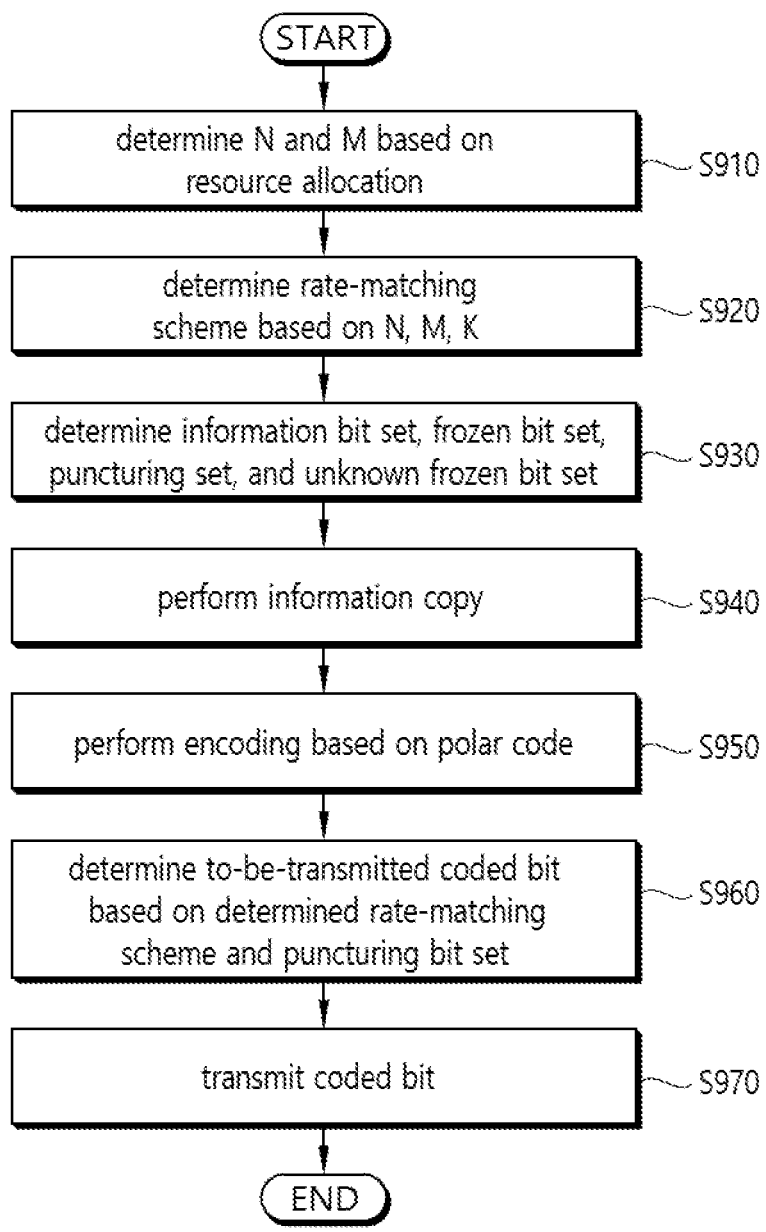
FIG. 9 is a flowchart of a procedure of performing encoding based on a polar code to support HARQ according to the present embodiment.

FIG. 9 is a flowchart of a procedure of performing encoding based on a polar code to support HARQ according to the present embodiment.

Hereinafter, parameters (i.e., K, N, M) for the polar code may be defined as follows. For example, K may be a length of an information bit. $N(=2^n$, where n is a natural number) may be a size of a mother matrix for the polar code (hereinafter, a mother polar code). In addition, M may be a length of a codeword.

For clear and concise understanding of FIG. 9, the parameters (i.e., K, N, M) for the polar code may be assumed as (3, 8, 6) as shown in FIG. 7.

In step S910, if a length K of an information bit is '3', a first wireless device serving as an encoder may determine values N and M based on a pre-allocated resource. For example, according to the above assumption, the first wireless device may determine that N is '8' and M is '6'.

In step S920, the first wireless device may determine a rate-matching scheme according to the parameters (i.e., K, N, M) for the polar code. In this case, the rate-matching scheme may include a puncturing scheme or a repetition scheme.

For example, since the parameters (i.e., K, N, M) for the polar code are (3, 8, 6), the rate-matching scheme may be determined as the puncturing scheme.

In step S930, the first wireless device may determine an information bit set, a frozen bit set, a puncturing bit set, and an unknown frozen bit set based on the parameters (i.e., K, N, M) for the polar code and the rate-matching scheme.

For example, an information bit set Ac2 (i.e., u2, u6, u7) for an optimized location for an information bit having a size of 3 in FIG. 8 may be {2,6,7}.

For example, the first wireless device of FIG. 8 may determine the frozen bit set and the puncturing bit set. For example, as shown in FIG. 7, the frozen bit set and the puncturing bit set may have the same index as {0,1} according to a hierarchical characteristic of the mother matrix.

For example, the first wireless device of FIG. 8 may determine the unknown frozen bit set. For example, as shown in FIG. 7, the index of the unknown frozen bit set may be {5}.

In other words, the unknown frozen bit may be generated when the information bit set Ac2 of an optimized location for HARQ retransmission is different from an information bit set Ac2 of an optimized location for previous transmission.

In step S940, the first wireless device may perform an information copy scheme.

For example, as shown in FIG. 7, an information bit located at an input vector u5 is copied to an input vector u2, and thereafter the existing input vector u5 may be used as an unknown frozen bit.

As described above, a location at which the information copy scheme is applied may be determined based on a decoding order predetermined based on a structural characteristic of a mother matrix.

In step S950, the first wireless device may perform encoding based on the polar code. For example, referring to FIG. 7, the first wireless device may perform encoding by using an input vector set (i.e., u0,u1,u2,u3,u4,u5,u6,u7)=(0, 0,u2,u5,u4,u5,u6,u7)) and a length-8 mother matrix (e.g., Table 2).

In step S960, the first wireless device may determine a coded bit to be transmitted to a second device based on the determined rate-matching scheme and puncturing bit set.

For example, as shown in FIG. 7, according to a puncturing pattern (i.e., $P_N$=(0,0,1,1,1,1,1,1)) among length-8 coded bits x0, . . . , x7, length-6 coded bits x2, x3, x4, x5, x6, and x7 may be determined as the coded bit to be transmitted.

In step S970, the first wireless device may transmit the coded bit (e.g., x2,x3,x4,x5,x6,x7 of FIG. 7) determined in step S860 to the second wireless device.

Figure 10:
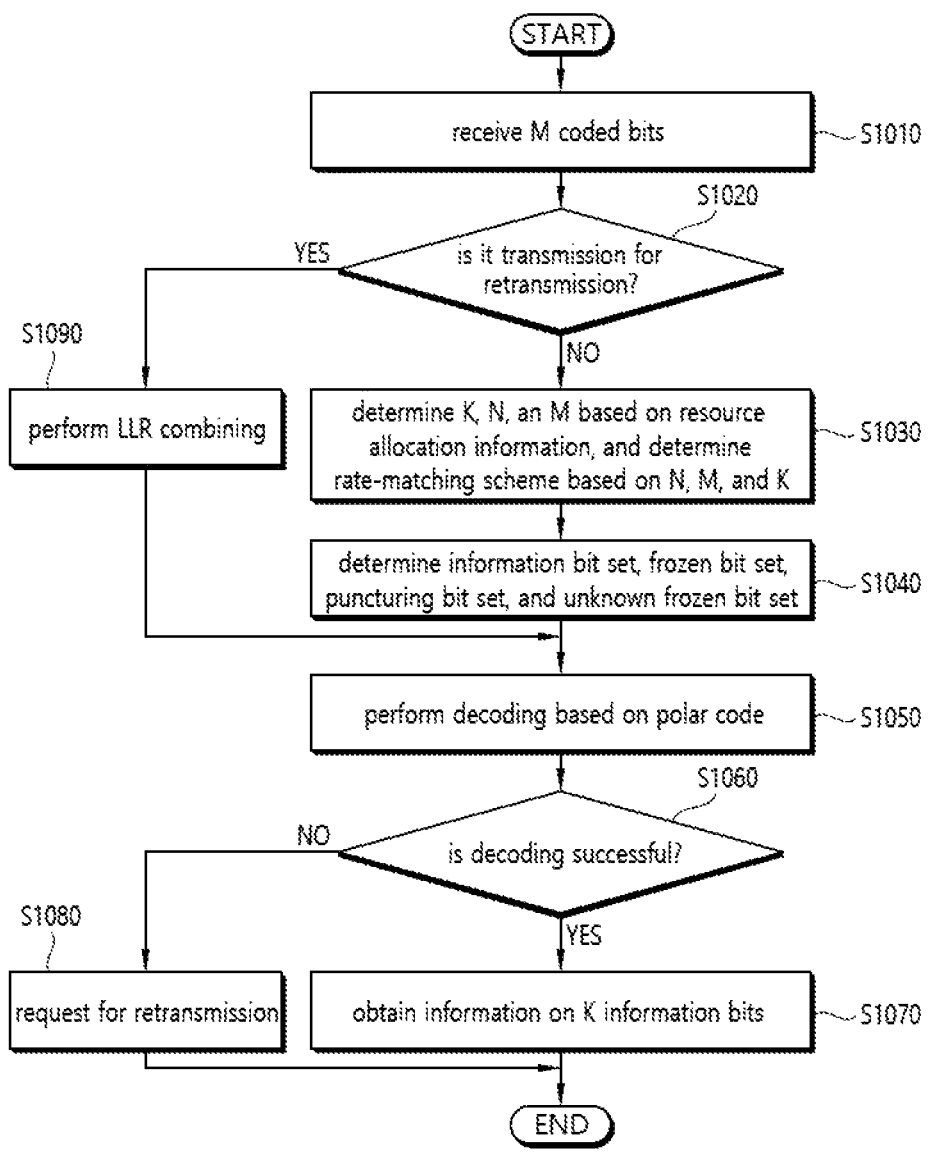
FIG. 10 is a flowchart of a procedure of performing decoding based on a polar code to support HARQ according to the present embodiment.

FIG. 10 is a flowchart of a procedure of performing decoding based on a polar code to support HARQ according to the present embodiment.

Referring to FIG. 9 and FIG. 10, in step S1010, a second wireless device of FIG. 10 serves as a decoder and may receive M coded bits from a first wireless device.

In step S1020, the second wireless device of FIG. 10 may determine whether the received M coded bits are received for HARQ retransmission.

If it is determined that the M coded bits received in the second wireless device are received for HARQ retransmission, the procedure proceeds to step S1090. The step S1090 will be described later.

Otherwise, if it is determined that the M coded bits received in the second wireless device are not received for HARQ retransmission, the procedure proceeds to step S1030.

In step S1030, the second wireless device of FIG. 10 may determine values K, N, and M for the M coded bits based on a pre-allocated resource. In addition, the second wireless device of FIG. 10 may determine a rate-matching scheme based on the determined values K, N, and M.

For example, the second wireless device of FIG. 10 may determine that K is '3', N is '8', and M is '4', as shown in FIG. 6, based on received coded bits (e.g., y4,y5,y6,y7 of FIG. 6).

For example, the second wireless device of FIG. 10 may determine a rate-matching scheme applied to the M coded bits based on the determined parameters (i.e., K, N, M) for the polar code.

For example, since (K, N, M) is (3, 8, 4) as shown in FIG. 6, the second wireless device of FIG. 10 may determine the rate matching scheme as a puncturing scheme.

In step S1040, the second wireless device of FIG. 10 may determine an information bit set, a frozen bit set, a puncturing bit set, and an unknown frozen bit set based on the parameters (i.e., K, N, M) for the polar code and the rate-matching scheme.

For example, an information bit set Ac1 (i.e., u5, u6, u7) for an optimized location for an information bit having a size of 3 in FIG. 10 may be {5,6,7}.

For example, as shown in FIG. 6, the frozen bit set and the puncturing bit set may have the same index as {0,1,2,3} according to a hierarchical characteristic of the mother matrix.

For example, as shown in FIG. 6, the index of the unknown frozen bit may be absent.

In step S1050, the second wireless device of FIG. 10 may perform decoding based on the polar code.

Herein, the second wireless device of FIG. 10 may determine whether decoding is possible with a polar code having a smaller size than N based on a hierarchical characteristic of the mother matrix.

For example, the second wireless device of FIG. 10 may use a length-4 mother matrix (e.g., Table 1), rather than a length-8 mother matrix (e.g., Table 2), as shown in FIG. 6, in order to decode coded bits (e.g., y4,y5,y6,y7 of FIG. 6).

In step S1060, the second wireless device of FIG. 10 may determine whether a decoding operation is successfully performed on the received coded bit.

If it is determined that the decoding on the received coded bit is successful, in step S1070, the second wireless device of FIG. 10 may obtain information on a length-K information bit from the received coded bit.

Otherwise, if it is determined that the decoding on the received coded bit fails, in step S1080, the second wireless device of FIG. 10 may request for retransmission.

In step S1090, if it is determined that the received M coded bits are received for HARQ retransmission, the second wireless device of FIG. 10 may perform log-likelihood ratio (LLR) combining.

When step S1050 is performed subsequent to step S1090 in order to perform HARQ retransmission, a coded bit corresponding to the unknown frozen bit of FIG. 10 may be decoded according to an information copy scheme by using a bit value of a location to be encoded first.

Figure 11:
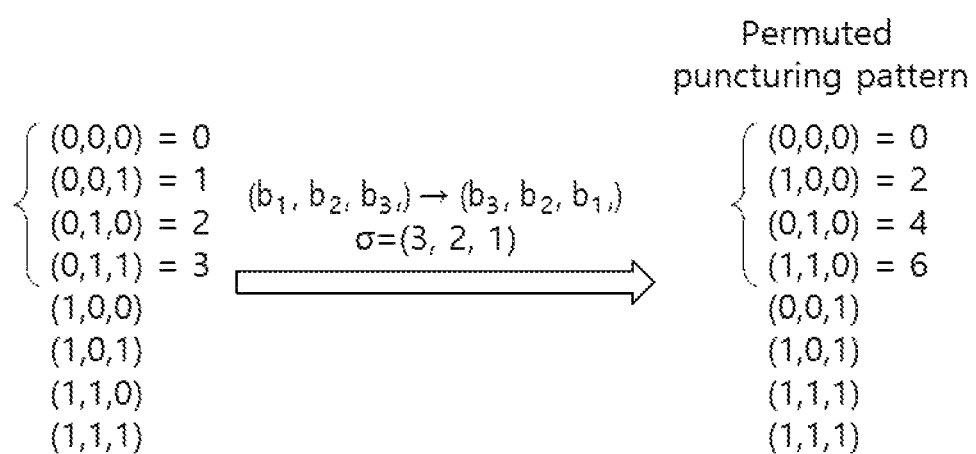
FIG. 11 is a conceptual view showing a characteristic of a permuted puncturing pattern of successive puncturing according to the present embodiment.

FIG. 11 is a conceptual view showing a characteristic of a permuted puncturing pattern of successive puncturing according to the present embodiment.

Referring to FIG. 5 and FIG. 11, a location index for an input vector (e.g., u0, u7) may be expressed by a 3-bit binary number (b1,b2,b3).

In FIG. 11, Πn may be defined as a set including all possible length-n permutations. For example, Π3 may include {(1,2,3), (1,3,2), (2,1,3), (2,3,1), (3,1,2), (3,2,1)}.

In this case, a permutation 6 may be defined for any n. Herein, σ may be understood as an element of Πn.

In addition, a location index set or a puncturing pattern undergone a bit-level permutation for a seed puncturing pattern of Equation 8 may be defined based on Equation 9 below.

$$B_{P_N,\sigma}{}^N = \{g^{-1}((b_{\sigma(n)}{}^i, \ldots, b_{\sigma(1)}{}^i)) : i \in B_{P_N}{}^N\}, \quad \text{[Equation 9]}$$

where $g^{-1}(x)$ maps the binary vector $(b_n, \ldots, b_1)$ to the value $\sum_{i=1}^{n} b_i 2^{n-1}$ In the present specification, a hierarchical puncturing pattern may be understood as the concept including both the seed puncturing pattern based on Equation 8 and a bit-level permuted puncturing pattern based on Equation 9.

For example, a location index of the puncturing pattern (punctured coded bits) of FIG. 11 may be B_PN={0,1,2,3}. Referring to FIG. 11, when 6 for bit-level permutation is (3,2,1), a location index of the bit-level permuted puncturing pattern of FIG. 9 may be B_PN={0,4,2,6}.

In other words, the hierarchical puncturing pattern may include both $\dot{p}_4^8=(0,0,0,0,1,1,1,1)$ based on Equation 8 and $\dot{p}_{4(3,2,1)}^8=(0,1,0,1,0,1,0,1)$ based on Equation 9. When the hierarchical puncturing pattern is used, decoding may be performed by using a polar code of short length (i.e., $\overline{N}<N$) in a decoding process.

Figure 12:
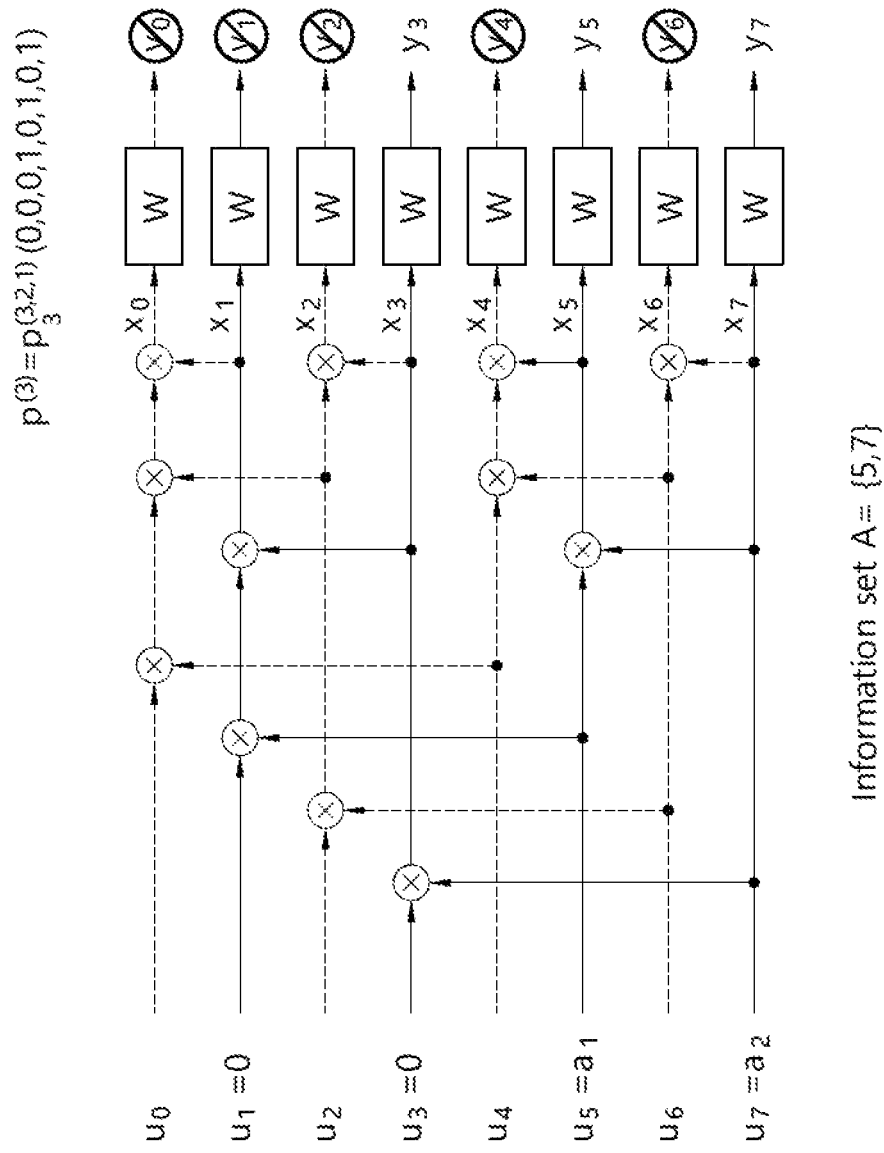
FIG. 12 and FIG. 13 are conceptual views for a method of performing encoding based on a polar code to support HARQ according to another present embodiment.
Figure 13:
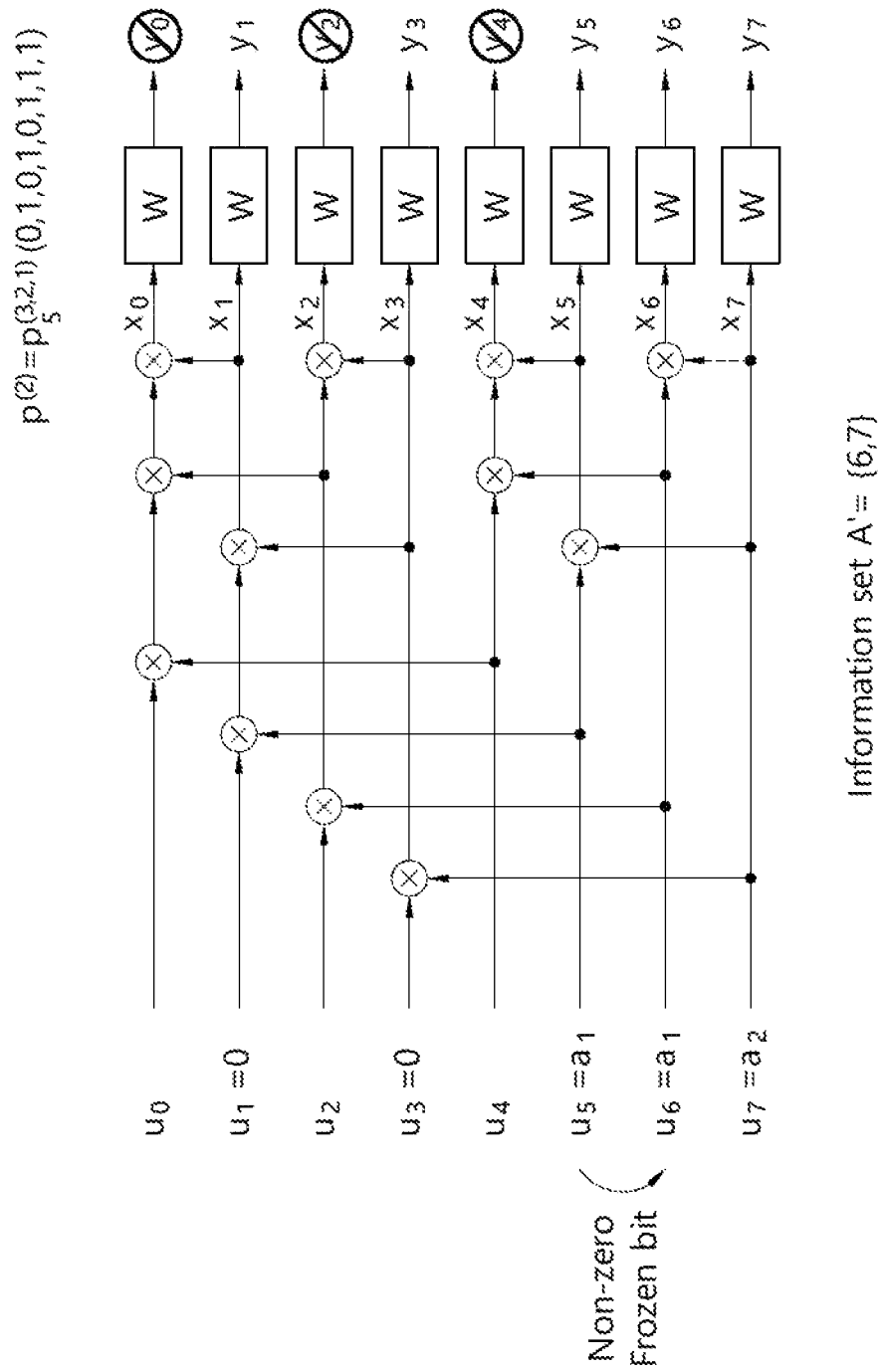

FIG. 12 and FIG. 13 are conceptual views for a method of performing encoding based on a polar code to support HARQ according to another present embodiment.

Referring to FIG. 11 and FIG. 12, it is shown a case where a length of a coded bit output form a length-8 polar code is '3'. In this case, an index set A indicating an optimized location for an information bit set of FIG. 12 may be determined as {5,7}.

Next, a wireless device serving as an encoder may transmit a coded bit based on an index set A and a puncturing pattern {0,0,0,1,0,1,0,1}.

When a decoding operation is performed by using an input vector (u1, u3, u5, u7) and a punctured coded bit (y3, y5, y7), it will be understood that, in consideration of a hierarchical puncturing characteristic, a length-4 mother matrix (e.g., Table 1) may be used, instead of a length-8 mother matrix (e.g., Table 2).

Referring to FIG. 11 to FIG. 13, it is shown a case where a length of a coded bit output from the length-8 polar code is increased from '3' to '5' according to retransmission. In case of FIG. 13, an index set A' indicating an optimized location for an information bit set of FIG. 13 is determined as {6,7}.

When retransmission is performed as shown in FIG. 13, to satisfy a rate-compatibility condition, an information bit is necessarily included in u5 and u7 corresponding to {5,7} which is the location index set A of FIG. 12.

Referring to FIG. 13, an information bit at u5 may be copied to u6 according to an information copy scheme. For example, it may be considered that u6 is at a location decoded before u5 in a decoding process. In addition, u5 may be used as an unknown frozen bit.

Eventually, in case of FIG. 13, an information bit may be transmitted through an index set A' while satisfying the rate-compatibility condition.

Hereinafter, it is described a method of designing a polar code supporting rate-compatibility using a hierarchical puncturing characteristic and an information-copy technique.

For example, a rate-compatible polar code may be designed so that k information bits are transmitted with m various code rates (r1=k/N1< . . . <rm=k/Nm). In this case, m puncturing patterns may be defined as p(1), p(2), . . . , p(m).

In the present specification, the puncturing pattern may be defined as shown in Equation 10 below.

$$p^{(i)}=\dot{p}_{N_i,\sigma}^N \quad [\text{Equation 10}]$$

In Equation 10 above, σ may be a parameter value satisfying σ∈Πn for any σ. For example, an information set A may be designed by using a punctured polar code (i.e., a code rate rm) having a highest code rate.

Based on the aforementioned puncturing patterns, the information set A, and a method of Table 3 below, an information set suitable for other punctured polar codes and a mother polar code may be designed.

In addition, a non-zero frozen vector may be designed by applying optimized information sets and an algorithm of Table 4 below.

TABLE 3

| Algorithm 1 Improved information sets |
|---|
| Input: <br> $r_i = \dfrac{k}{N_i}$ for i ∈ {1, ... , m} with $r_i < r_j$ if i < j. <br><br> Information set $\mathcal{A}$. <br> Seed parameter σ ∈ $\Pi_{\overline{n}_1}$. <br> Output: $\mathcal{A}^{(j)}$ for j ∈ {1, ... , J − 1}. <br> Algorithm: <br> $\overline{n}_i = \lceil \log N_i \rceil$ and $\overline{N}_i = 2^{\overline{n}_i}$ for i ∈ {1, ... , m}. <br> Let J be the number of distinct values in $\{\overline{N}_1, ... , \overline{N}_m\}$. <br> denoted by $\overline{L}_1 = \overline{N}_1 > \overline{L}_2 > ... > \overline{L}_J = \overline{N}_m$. <br> $\mathcal{A}^{(J)} = \mathcal{A}$ <br> For j = J − 1, ... , 1 <br>   1) Find $t^\dagger = \min_t \{\overline{N}_t : \overline{N}_t = \overline{L}_j\}$. <br><br>   2) Define $\mathcal{A}$ by taking the indices of the k largest reliabilities in $\{I(W_{p(i^\dagger)}^{(i)}): i \in [1:m]\}$. <br><br>   3) As in (12), define the information-copy set as <br>     $\mathcal{I}_c = (\mathcal{A} \setminus \mathcal{A}^{(j+1)}) \cap \mathcal{B}_{p_{L_{j+1}}^\sigma}$. <br><br>   4) Define $\mathcal{A}^{(j)}$ by taking the indices in $\mathcal{I}_c$ and the k − $|\mathcal{I}_c|$ indices in $\mathcal{A}^{(j+1)}$ corresponding to the largest reliabilities in $\{I(W_{p(i^\dagger)}^{(i)}): i \in [1:m]\}$. |

An encoding process for a rate-compatible polar code according to the present embodiment may be the same as the existing process. However, instead of an all-zero frozen vector, a non-zero frozen vector (or information-bit dependent frozen vector) obtained through Table 4 below may be used. For example, information bits may be copied in some portions of a frozen vector according to an information-copy method.

In case of FIG. 13, an input vector may be (u0,u1,u2,u3, u4,u5,u6,u7)=(0,0,0,0,0,u5,u6,u7). That is, a non-zero frozen vector may be u0,u1,u2,u3,u4,u5,u6,u7)=(0,0,0,0,0,u5, 0,0). In other words, a frozen vector according to the present embodiment is not always an all-zero vector, and may be determined depending on an information bit.

In addition, the algorithm of Table 3 may be performed only once, whereas the algorithm of Table 4 may be performed every initial transmission in HARQ-IR in order to obtain a non-zero frozen vector (or information-dependent frozen vector).

TABLE 4

| Algorithm 2 Information-dependent frozen vector |
|---|
| Initialization: <br>  • Information set $\mathcal{A}^{(j)}$ for j ∈ {1, ..., J}. <br>  • Define the <br>     $\mathcal{A}^{(j)} - \mathcal{A}^{(j+1)} \triangleq \{i_1^{(j)}, ..., i_{d_j}^{(j)}\}$ <br>     $\mathcal{A}^{(j+1)} - \mathcal{A}^{(j)} \triangleq \{\ell_1^{(j)}, ..., \ell_{d_j}^{(j)}\}$ <br>     for j ∈ {1, ..., J − 1}. <br> Input: <br>  • Information bits $(a_1, ..., a_k)$ <br> Output: $u_{\overline{N}_1} = (u_0, u_1, ..., u_{\overline{N}_1-1})$. |

TABLE 4-continued

Algorithm 2 Information-dependent frozen vector

Algorithm:
- $u_{\overline{N_1}} = (u_0, u_1, ..., u_{\overline{N_1}-1})$ with $u_i = a_i$ for $i \in A^{(j)}$ and $u_i = 0$, otherwise.
- For $j = J - 1, ..., 1$
  Assign the non-zero frozen bits as $u_{i_t} = {}^{u_t} r_t$ for $t \in [1 : d_j]$.

Figure 14:
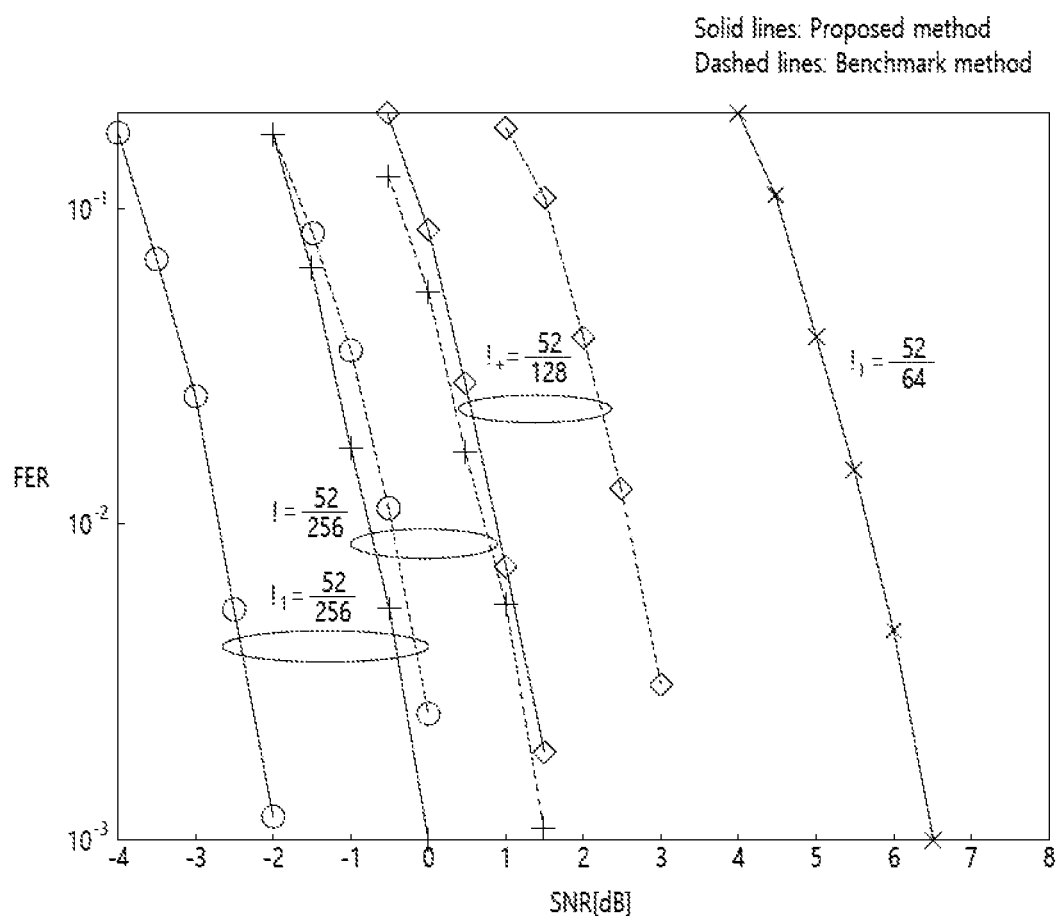
FIG. 14 shows a simulation result for a polar code design supporting rate-compatibility according to the present embodiment.

FIG. 14 shows a simulation result for a polar code design supporting rate-compatibility according to the present embodiment.

Referring to FIG. 14, it may be assumed that a length K of an information bit is '52', and K includes an 8-bit CRC bit. It may also be assumed that a code rate is r1 (52/256)<r2 (52/192)<r3 (52/192)<r4 (52/64). In this case, a puncturing pattern may be determined as shown in Equation 11 below.

$$p^{(1)}=(1,\ldots,1), p^{(2)}=\dot{p}_{192,(8,7,\ldots,1)}{}^{256}, p^{(3)}=\dot{p}_{128,(8,7,\ldots,1)}{}^{256}, p^{(4)}=\dot{p}_{64,(8,7,\ldots,1)}{}^{256}$$ [Equation 11]

For example, in HARQ-IR, first transmission is performed with a punctured polar code of a highest code rate, i.e., a code rate r4. Next, in second retransmission, a redundancy coded bit corresponding to indices belonging to Bp(4)-Bp(3) may be transmitted.

Next, signals received in first and second transmissions may be combined to configure a punctured polar code of a code rate r3. Similarly, in third transmission, a redundancy coded bit corresponding to Bp(3)-Bp(2) may be transmitted.

Finally, in fourth transmission, a redundancy coded bit corresponding to Bp(2)-Bp(1) may be transmitted. That is, when all reception signals received until fourth transmission are combined, a mother polar code with a code rate r1 may be configured.

Referring to FIG. 14, it is seen that a frame-error-rate (FER) result corresponds to a code rate r4>r3>r2>r1 for each transmission. According to the present embodiment, it is seen that an optimized information set can be used for each punctured polar code which exists in a family by using a non-zero frozen vector (or information-dependent frozen vector).

Figure 15:
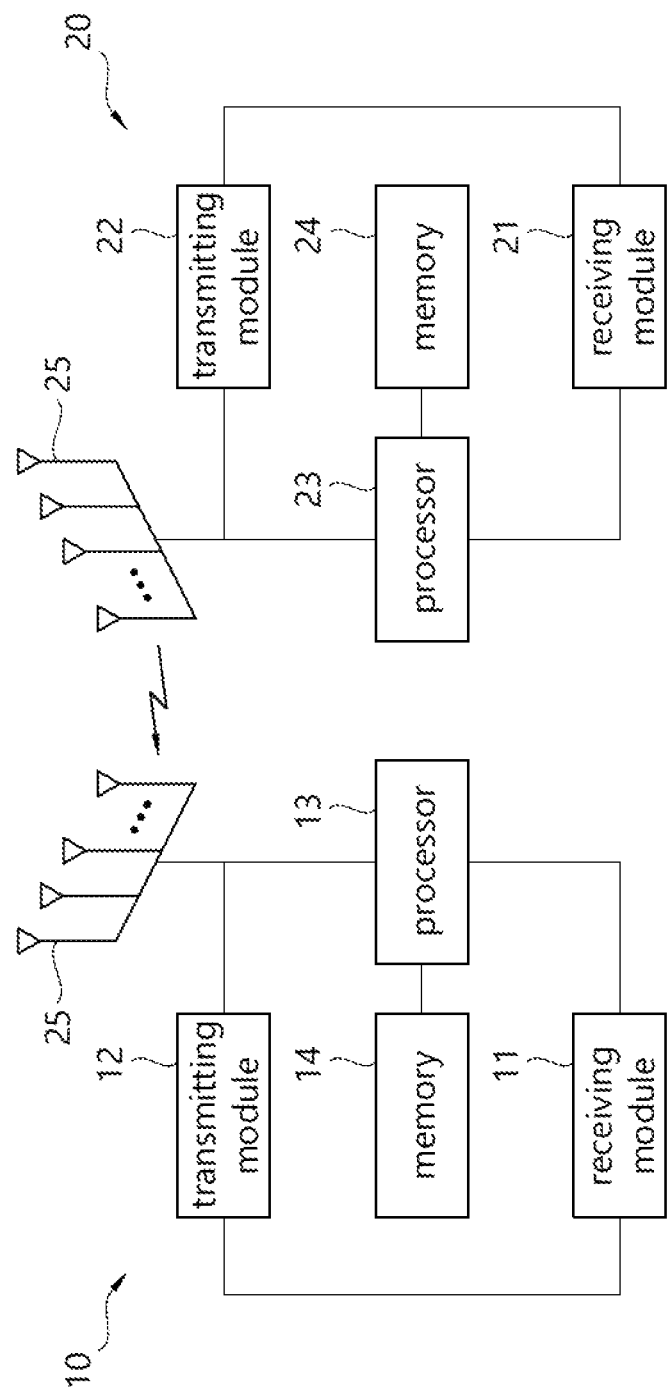
FIG. 15 is a drawing for explaining a wireless device to which the present embodiments are applicable.

FIG. 15 is a drawing for explaining a wireless device to which the present embodiments are applicable.

A BS 10 of FIG. 15 may include a receiving module 11, a transmitting module 12, a processor 13, a memory 14, and a plurality of antennas 15.

For example, the receiving module 11 may receive various signals, data, and information from an external device (e.g., UE). The transmitting module 12 may transmit various signals, data, and information to the external device (e.g., UE). In this case, the receiving module 11 and the transmitting module 12 may be included in one transceiver.

For example, the process 13 may control an overall operation of the BS 10. In addition, the processor 13 may perform a function of arithmetically processing information received in the BS 10 and information to be transmitted to the outside by the BS 10.

For example, the memory 14 may store the arithmetically processed information for a specific time. The plurality of antennas 15 are configured to support MIMO transmission/reception, and may be configured according to a 2D antenna arrangement.

A UE 20 of FIG. 15 may include a receiving module 21, a transmitting module 22, a processor 23, a memory 24, and a plurality of antennas 25.

For example, the receiving module 21 may receive various signals, data, and information from an external device (e.g., BS). The transmitting module 22 may transmit various signals, data, and information to the external device (e.g., BS). In this case, the receiving module 21 and the transmitting module 22 may be included in one transceiver.

For example, the process 23 may control an overall operation of the UE 20. In addition, the processor 23 may perform a function of arithmetically processing information received in the UE 20 and information to be transmitted to the outside by the UE 20.

For example, the memory 24 may store the arithmetically processed information for a specific time. The plurality of antennas 25 are configured to support MIMO transmission/reception, and may be configured according to a 2D antenna arrangement.

In the present specification, a downlink transmitting entity or an uplink receiving entity is described by taking a BS for example, and a downlink receiving entity or an uplink transmitting entity is described by taking a UE for example. However, it will be understandable that the scope of the present specification is not limited thereto.

In the present specification, the aforementioned embodiments can be implemented through various means. For example, the aforementioned embodiments can be implemented in hardware, firmware, software, combination of them, etc.

In case of the hardware implementation, the aforementioned embodiments can be implemented by one or more application specific integrated circuits (ASICs), digital signal processors (DSPs), digital signal processing devices (DSPDs), programmable logic devices (PLDs), field programmable gate arrays (FPGAs), a processor, a controller, a microcontroller, a microprocessor, etc.

In a detailed description of the present specification, specific embodiments have been described, but various modifications are possible without departing from the scope of the present specification. Therefore, the scope of the present specification should not be limited to the above-described embodiments, but should be determined not only by the claims below but also by the equivalents of the claims of the present specification.

What is claimed is:

1. A method of performing encoding based on a polar code to support hybrid automatic repeat request (HARQ), the method comprising:
   configuring, by a wireless device, a length-N input vector (where N is a natural number) applied to a mother matrix predetermined based on the polar code;
   defining the input vector based on a first index set for an optimized location of a length-K information bit (where K is a natural number), a second index set for a location to be punctured among coded bits generated based on the mother matrix, and a third index set for a location of at least one unknown frozen bit associated with an information copy scheme;
   encoding, by the wireless device, length-N bits based on the input vector and the mother matrix;
   determining, by the wireless device, at least one transmission bit, among the length-N encoded bits, based on the second index set; and
   transmitting, by the wireless device, the at least one transmission bit to a second wireless device.

2. The method of claim 1,
   wherein the input vector is defined as $\{u0, u1, \ldots, uN-1\}$, wherein a location index for the input vector is defined as {0, 1, . . . , N−1}, and wherein the first index set to the third index set are defined based on {0, 1, . . . , N−1}.

3. The method of claim 2, wherein, when N is '8', decoding is performed based on the order of predetermined location indices {0}, {4}, {2}, {6}, {1}, {5}, {3}, {7}.

4. The method of claim 2, wherein the input vector is configured to include all of length-I second information bits (where I is a natural number) for previous transmission, and the number of elements included in the second index set is configured to be less than that in the previous transmission.

5. The method of claim 4, wherein, when K and I are both '3', when the first index set is {a, b, c} and the optimized location index for the second information bit for the previous transmission is {d, b, c}, the information included in the location index {d} is copied to a location index which is decoded before the location index {d} based on the information copy scheme.

6. The method of claim 5, wherein, when the location index {d} is copied to the location index {a}, the third index set of the input vector for HARQ retransmission includes {d}.

7. The method of claim 1, wherein the mother $G_N$ is defined in a form of a Kronecker product of a base matrix F as follows:

$$G_N = F^{\otimes N},$$

when the base matrix F is defined as follows:

$$F = \begin{bmatrix} 1 & 0 \\ 1 & 1 \end{bmatrix}.$$

8. The method of claim 7, wherein the mother matrix has a size of N×N (where N is a natural number, and N is 2^n (where n is a natural number).

9. The method of claim 8, wherein the second index set is defined as follows:

$$B_{p\overline{N}}^N = \{0, 1, \ldots, \overline{N}\} \text{ for some integer } \overline{N} = 2^{\overline{n}} \text{ with } 1 \leq \overline{n} \leq n.$$

10. The method of claim 1, wherein an input vector of a location for the second index set includes a frozen bit having a predetermined value.

11. A wireless device for performing encoding based on a polar code to support hybrid automatic repeat request (HARQ), the wireless device comprising:

a radio frequency (RF) unit transmitting and receiving a radio signal; and a processor operatively coupled to the RF unit, wherein the processor is configured to:

configure a length-N input vector (where N is a natural number) applied to a mother matrix predetermined based on the polar code;

define the input vector based on a first index set for an optimized location of a length-K information bit (where K is a natural number), a second index set for a location to be punctured among coded bits generated based on the mother matrix, and a third index set for a location of at least one unknown frozen bit associated with an information copy scheme;

encode length-N bits based on the input vector and the mother matrix;

determine at least one transmission bit, among the length-N encoded bits, based on the second index set; and transmit the at least one transmission bit to a second wireless device.

12. The wireless device of claim 11, wherein the input vector is defined as {u0, u1, . . . , uN−1}, wherein a location index for the input vector is defined as {0, 1, . . . , N−1}, and wherein the first index set to the third index set are defined based on {0, 1, . . . , N−1}.

13. The wireless device of claim 12, wherein, when N is '8', decoding is performed based on the order of predetermined location indices {0}, {4}, {2}, {6}, {1}, {5}, {3}, {7}.

14. The wireless device of claim 12, wherein the input vector is configured to include all of length-I second information bits (where I is a natural number) for previous transmission, and the number of elements included in the second index set is configured to be less than that in the previous transmission.

15. The wireless device of claim 14, wherein, when K and I are both '3', when the first index set is {a, b, c} and the optimized location index for the second information bit for the previous transmission is {d, b, c}, the information included in the location index {d} is copied to a location index which is decoded before the location index {d} based on the information copy scheme.

16. The wireless device of claim 15, wherein, when the location index {d} is copied to the location index {a}, the third index set of the input vector for HARQ retransmission includes {d}.

17. The wireless device of claim 11, wherein the mother method matrix GN is defined in a form of a Kronecker product of a base matrix F as follows:

$$G_N = F^{\otimes N}$$

when the base matrix F is defined as follows:

$$F = \begin{bmatrix} 1 & 0 \\ 1 & 1 \end{bmatrix}.$$

18. The wireless device of claim 17, wherein the mother matrix has a size of N×N (where N is a natural number, and N is 2^n (where n is a natural number).

19. The wireless device of claim 18, wherein the second index set is defined as follows:

$$B_{p\overline{N}}^N = \{0, 1, \ldots, \overline{N}\} \text{ for some integer } \overline{N} = 2^{\overline{n}} \text{ with } 1 \leq \overline{n} \leq n.$$

* * * * *